(12) United States Patent
Kawasaki

(10) Patent No.: US 12,407,329 B2
(45) Date of Patent: Sep. 2, 2025

(54) ACOUSTIC WAVE DEVICE

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 252 days.

(21) Appl. No.: 18/219,741

(22) Filed: Jul. 10, 2023

(65) Prior Publication Data

US 2023/0353126 A1 Nov. 2, 2023

Related U.S. Application Data

(63) Continuation of application No. PCT/JP2021/048243, filed on Dec. 24, 2021.

(30) Foreign Application Priority Data

Feb. 1, 2021 (JP) ................. 2021-014347

(51) Int. Cl.
 *H03H 9/64* (2006.01)
 *H03H 9/25* (2006.01)
 *H03H 9/72* (2006.01)

(52) U.S. Cl.
 CPC ............ *H03H 9/6483* (2013.01); *H03H 9/25* (2013.01); *H03H 9/725* (2013.01)

(58) Field of Classification Search
 CPC ......... H03H 9/6483; H03H 9/25; H03H 9/725
 See application file for complete search history.

(56) References Cited

U.S. PATENT DOCUMENTS

2009/0302970 A1 12/2009 Hatano et al.
2009/0309673 A1 12/2009 Iwamoto
(Continued)

FOREIGN PATENT DOCUMENTS

JP 2009296508 A 12/2009
JP 2019021904 A 2/2019
(Continued)

OTHER PUBLICATIONS

International Search Report in PCT/JP2021/048243, mailed Mar. 22, 2022, 3 pages.
(Continued)

*Primary Examiner* — Samuel S Outten
(74) *Attorney, Agent, or Firm* — Keating & Bennett, LLP

(57) ABSTRACT

A multiplexer includes first and second filters, a resin layer, and an electrically conductive layer. A pass band of the first filter is different from a pass band of the second filter. The first filter is in contact with an electrically conductive layer, and the second filter is not in contact with the electrically conductive layer. The second filter has a greater thermal resistance value than the first filter, and lowers the pass band in response to a temperature rise. A region of the piezoelectric substrate closer to the first filter is a first region, and a region of the piezoelectric substrate farther from the first filter is a second region. Areas in the first and second regions where an acoustic wave resonator included in a parallel-arm circuit is provided are first and second areas. The second area is greater than the first area.

28 Claims, 12 Drawing Sheets

(56) References Cited

U.S. PATENT DOCUMENTS

| | | | |
|---|---|---|---|
| 2012/0223789 A1* | 9/2012 | Inoue | H03H 9/02102 |
| | | | 310/313 C |
| 2015/0008789 A1 | 1/2015 | Iwamoto | |
| 2017/0141066 A1* | 5/2017 | Toyota | H03H 9/059 |
| 2017/0273183 A1 | 9/2017 | Kawasaki et al. | |
| 2019/0028083 A1 | 1/2019 | Yasuda | |
| 2019/0230781 A1 | 7/2019 | Onodera | |

FOREIGN PATENT DOCUMENTS

| | | |
|---|---|---|
| WO | 2008105199 A1 | 9/2008 |
| WO | 2013146374 A1 | 10/2013 |
| WO | 2016088681 A1 | 6/2016 |
| WO | 2018092529 A1 | 5/2018 |

OTHER PUBLICATIONS

Written Opinion in PCT/JP2021/048243, mailed Mar. 22, 2022, 4 pages.

* cited by examiner

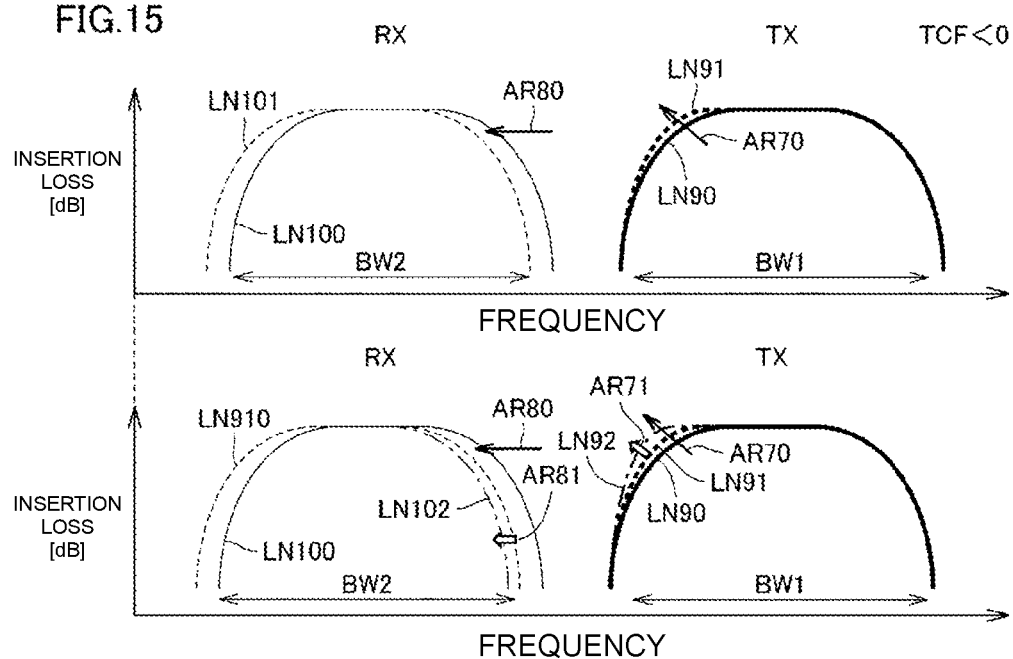
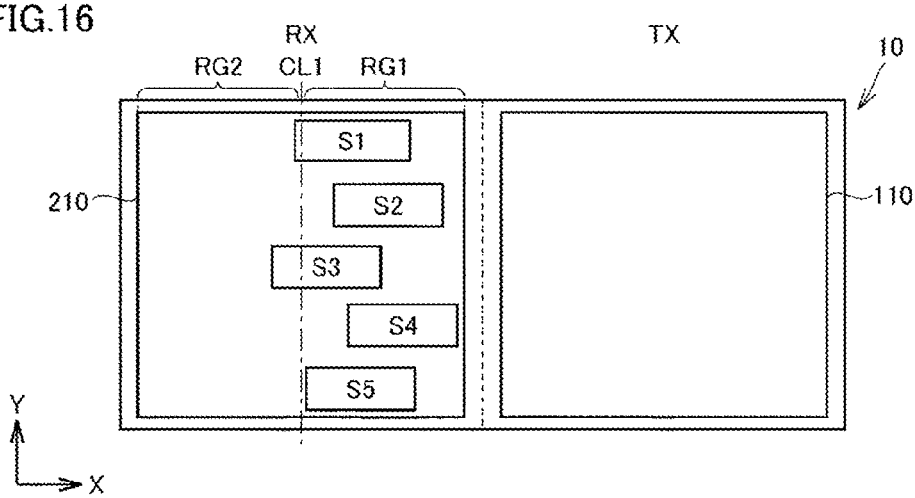

ACOUSTIC WAVE DEVICE

CROSS REFERENCE TO RELATED APPLICATIONS

This application claims the benefit of priority to Japanese Patent Application No. 2021-014347 filed on Feb. 1, 2021 and is a Continuation Application of PCT Application No. PCT/JP2021/048243 filed on Dec. 24, 2021. The entire contents of each application are hereby incorporated herein by reference.

BACKGROUND OF THE INVENTION

1. Field of the Invention

The present invention relates to an acoustic wave device including an acoustic wave element, and more specifically, to a technology to reduce degradation of characteristics of a multiplexer including multiple acoustic wave elements due to a temperature rise.

2. Description of the Related Art

International Publication No. 2013/146374 discloses a structure including multiple acoustic wave elements mounted on a mount board by flip chip bonding. In the acoustic wave device disclosed in International Publication No. 2013/146374, the acoustic wave elements on the mount board are sealed with resin, and a support board forming the acoustic wave elements is disposed in direct contact with a highly thermally conductive member. This structure can immediately dissipate heat generated by the acoustic wave elements to the outside via the highly thermally conductive member. Thus, the acoustic wave device can improve the heat dissipation performance, and reduce degradation of the characteristics of the acoustic wave device.

In such a structure as that in International Publication No. 2013/146374, heat generated by one acoustic wave element may be transferred to another acoustic wave element via the sealing resin and the highly thermally conductive member.

The material of the piezoelectric substrate forming the acoustic wave elements may vary between the acoustic wave elements. In this case, the acoustic wave elements may have different temperature characteristics. When heat generated by one acoustic wave element is transferred to a different acoustic wave element via the sealing resin or the highly thermally conductive member for heat dissipation, the characteristics of the different acoustic wave element may be degraded.

SUMMARY OF THE INVENTION

Preferred embodiments of the present invention provide acoustic wave devices each including multiple acoustic wave elements with reduced degradation of characteristics due to heat.

An acoustic wave device according to a preferred embodiment of the present invention includes a mount board, a first filter and a second filter on the mount board, a resin layer sealing the first filter and the second filter, and an electrically conductive layer covering the resin layer. The second filter is adjacent to the first filter in a first direction. The second filter has a pass band higher than a pass band of the first filter. Each of the first filter and the second filter includes a piezoelectric substrate, and an acoustic wave resonator on the piezoelectric substrate. The first filter is in contact with the electrically conductive layer, and the second filter is not in contact with the electrically conductive layer. The second filter is a ladder acoustic wave filter including at least one parallel-arm resonator and at least one series-arm resonator, or a longitudinally coupled acoustic wave filter including at least one longitudinally coupled resonator. A thermal resistance value of the piezoelectric substrate in the second filter in the first direction is greater than a thermal resistance value of the piezoelectric substrate in the first filter in the first direction. The second filter has characteristics lowering the pass band in response to a temperature rise of the piezoelectric substrate of the second filter. With respect to a virtual line perpendicular or substantially perpendicular to the first direction and passing through a center of the piezoelectric substrate of the second filter, a region of the piezoelectric substrate closer to the first filter is defined as a first region, and a region of the piezoelectric substrate farther from the first filter is defined as a second region. All of the at least one parallel-arm resonator included in the ladder acoustic wave filter is defined as a parallel-arm circuit, all of the at least one series-arm resonator is defined as a series-arm circuit, and all of the at least one longitudinally coupled resonator included in the longitudinally coupled acoustic wave filter is defined as a longitudinally coupled circuit. Areas in the first region and the second region where the acoustic wave resonator included in the parallel-arm circuit or the longitudinally coupled circuit is provided are defined as a first area and a second area. The second area is greater than the first area.

An acoustic wave device according to a preferred embodiment of the present invention includes a mount board, a first filter and a second filter on the mount board, a resin layer sealing the first filter and the second filter, and an electrically conductive layer covering the resin layer. The second filter is adjacent to the first filter in a first direction. The second filter has a pass band higher than a pass band of the first filter. Each of the first filter and the second filter includes a piezoelectric substrate, and an acoustic wave resonator on the piezoelectric substrate. The first filter is in contact with the electrically conductive layer, and the second filter is not in contact with the electrically conductive layer. The second filter is a ladder acoustic wave filter including at least one parallel-arm resonator and at least one series-arm resonator, or a longitudinally coupled acoustic wave filter including at least one longitudinally coupled resonator. A thermal resistance value of the piezoelectric substrate in the second filter in the first direction is greater than a thermal resistance value of the piezoelectric substrate in the first filter in the first direction. The second filter has characteristics to raise the pass band in response to a temperature rise of the piezoelectric substrate of the second filter. With respect to a virtual line perpendicular or substantially perpendicular to the first direction and passing through a center of the piezoelectric substrate of the second filter, a region of the piezoelectric substrate closer to the first filter is defined as a first region, and a region of the piezoelectric substrate farther from the first filter is defined as a second region. All of the at least one parallel-arm resonator included in the ladder acoustic wave filter is defined as a parallel-arm circuit, all of the at least one series-arm resonator is defined as a series-arm circuit, and all of the at least one longitudinally coupled resonator included in the longitudinally coupled acoustic wave filter is defined as a longitudinally coupled circuit. Areas in the first region and the second region where the acoustic wave resonator included in the parallel-arm circuit or the longitudinally coupled circuit is provided are defined as a first area and a second area. The first area is greater than the second area.

An acoustic wave device according to a preferred embodiment of the present invention includes a mount board, a first filter and a second filter on the mount board, a resin layer sealing the first filter and the second filter, and an electrically conductive layer covering the resin layer. The second filter is adjacent to the first filter in a first direction. The second filter has a pass band lower than a pass band of the first filter. Each of the first filter and the second filter includes a piezoelectric substrate, and an acoustic wave resonator on the piezoelectric substrate. The first filter is in contact with the electrically conductive layer, and the second filter is not in contact with the electrically conductive layer. The second filter is a ladder acoustic wave filter including at least one parallel-arm resonator and at least one series-arm resonator, or a longitudinally coupled acoustic wave filter including at least one longitudinally coupled resonator. A thermal resistance value of the piezoelectric substrate in the second filter in the first direction is greater than a thermal resistance value of the piezoelectric substrate in the first filter in the first direction. The second filter has characteristics to raise the pass band in response to a temperature rise of the piezoelectric substrate of the second filter. With respect to a virtual line perpendicular or substantially perpendicular to the first direction and passing through a center of the piezoelectric substrate of the second filter, a region of the piezoelectric substrate closer to the first filter is defined as a first region, and a region of the piezoelectric substrate farther from the first filter is defined as a second region. All of the at least one parallel-arm resonator included in the ladder acoustic wave filter is defined as a parallel-arm circuit, all of the at least one series-arm resonator is defined as a series-arm circuit, and all of the at least one longitudinally coupled resonator included in the longitudinally coupled acoustic wave filter is defined as a longitudinally coupled circuit. Areas in the first region and the second region where the acoustic wave resonator included in the serial-arm circuit or the longitudinally coupled circuit is provided are defined as a third area and a fourth area. The fourth area is greater than the third area.

An acoustic wave device according to a preferred embodiment of the present invention includes a mount board, a first filter and a second filter on the mount board, a resin layer sealing the first filter and the second filter, and an electrically conductive layer covering the resin layer. The second filter is adjacent to the first filter in a first direction. The second filter has a pass band lower than a pass band of the first filter. Each of the first filter and the second filter includes a piezoelectric substrate, and an acoustic wave resonator on the piezoelectric substrate. The first filter is in contact with the electrically conductive layer, and the second filter is not in contact with the electrically conductive layer. The second filter is a ladder acoustic wave filter including at least one parallel-arm resonator and at least one series-arm resonator, or a longitudinally coupled acoustic wave filter including at least one longitudinally coupled resonator. A thermal resistance value of the piezoelectric substrate in the second filter in the first direction is greater than a thermal resistance value of the piezoelectric substrate in the first filter in the first direction. The second filter has characteristics to reduce the pass band in response to a temperature rise of the piezoelectric substrate of the second filter. With respect to a virtual line perpendicular or substantially perpendicular to the first direction and passing through a center of the piezoelectric substrate of the second filter, a region of the piezoelectric substrate closer to the first filter is defined as a first region, and a region of the piezoelectric substrate farther from the first filter is defined as a second region. All of the at least one parallel-arm resonator included in the ladder acoustic wave filter is defined as a parallel-arm circuit, all of the at least one series-arm resonator is defined as a series-arm circuit, and all of the at least one longitudinally coupled resonator included in the longitudinally coupled acoustic wave filter is defined as a longitudinally coupled circuit. Areas in the first region and the second region where the acoustic wave resonator included in the serial-arm circuit or the longitudinally coupled circuit is provided are defined as a third area and a fourth area. The third area is greater than the fourth area.

In each of the acoustic wave devices according to preferred embodiments of the present invention, an acoustic wave element (first filter) having a relatively small thermal resistance value is in contact with an electrically conductive layer covering the outer periphery of the acoustic wave element, and an acoustic wave element (second filter) having a relatively large thermal resistance value is not in contact with the electrically conductive layer. In accordance with the temperature characteristics of frequency of the second filter having a relatively large thermal resistance value, the position of the acoustic wave resonator included in the second filter is determined. This structure can reduce or prevent degradation of the characteristics of the acoustic wave devices due to heat.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 15 is a diagram describing a parallel-arrangement loss in case 4.

FIG. 16 is a diagram describing an arrangement of series-arm resonator units in case 4.

DETAILED DESCRIPTION OF THE PREFERRED EMBODIMENTS

Preferred embodiments of the present invention are described below in detail with reference to the drawings. Throughout the drawings, the same or equivalent components are denoted with the same reference signs without being redundantly described.

First Preferred Embodiment

Structure of Multiplexer

Figure 1:
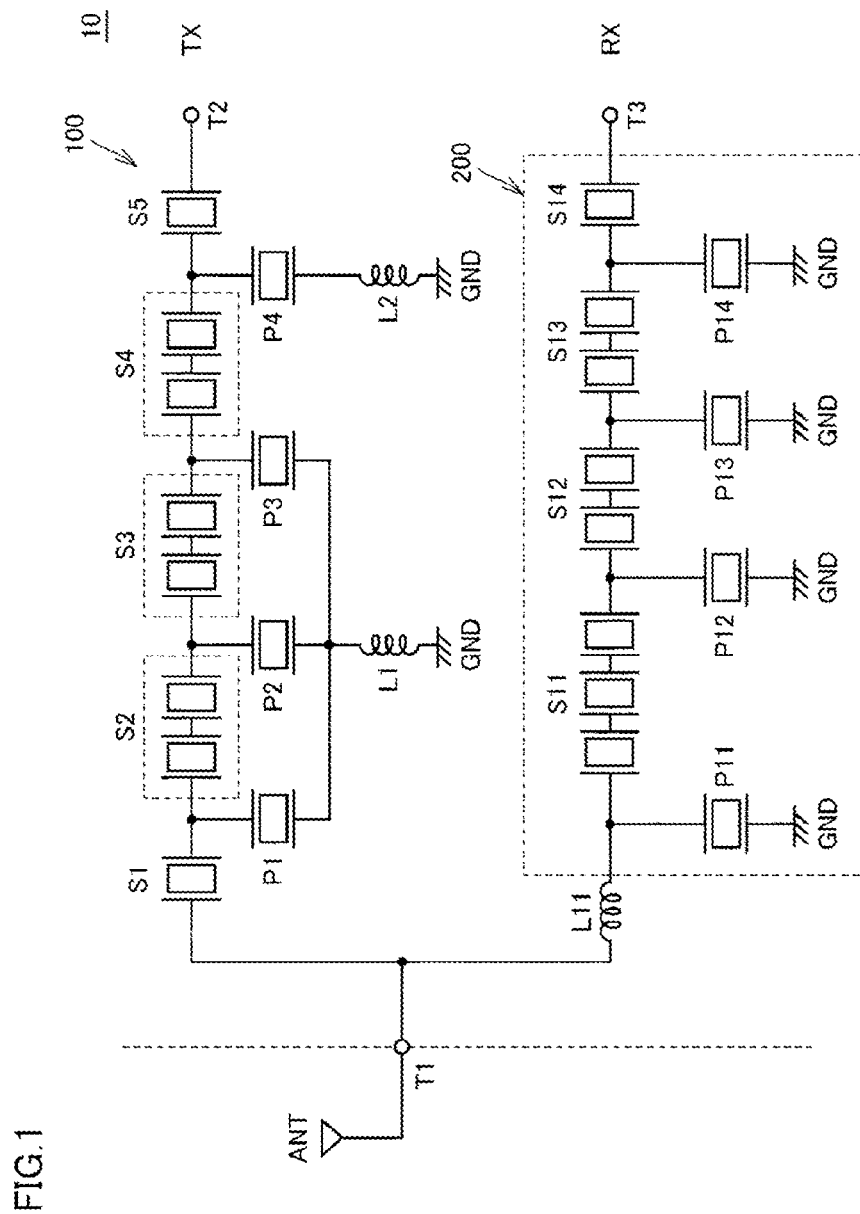
FIG. 1 is a diagram of an example of a circuit configuration of an acoustic wave device according to a first preferred embodiment of the present invention.

FIG. 1 is a diagram of a circuit configuration of a multiplexer 10 as an example of an acoustic wave device according to a first preferred embodiment of the present invention. The multiplexer 10 is a filter used for, for example, a transmission/reception circuit in a communication device.

With reference to FIG. 1, the multiplexer 10 includes an antenna terminal T1, and a transmission (TX) filter 100 and a reception (RX) filter 200 electrically connected to an antenna ANT at the antenna terminal T1. An example of the multiplexer 10 in FIG. 1 is a duplexer including two filters.

The filter 100 is a ladder filter connected between the antenna terminal T1 and a transmission terminal T2. The filter 100 filters a signal received at the transmission terminal T2 and outputs the signal from the antenna ANT. The filter 100 allows signals in a pass band BW1 (first pass band) to pass therethrough.

The transmission filter 100 includes a series-arm circuit including series-arm resonator units S1 to S5 serially connected between the antenna terminal T1 and the transmission terminal T2, and a parallel-arm circuit including parallel-arm resonator units P1 to P4 connected between the series-arm circuit and a ground potential GND. Each of the series-arm resonator units S1 to S5 and the parallel-arm resonator units P1 to P4 includes at least one acoustic wave resonator. In the example in FIG. 1, each of the series-arm resonator units S1 and S5 and the parallel-arm resonator units P1 to P4 includes one acoustic wave resonator, and each of the series-arm resonator units S2 to S4 includes two acoustic wave resonators. However, the number of acoustic wave resonators included in each resonator unit is not limited to this case, and may be appropriately selected in accordance with the characteristics of the filter. For example, a surface acoustic wave (SAW) resonator or a bulk acoustic wave (BAW) resonator may be used as each acoustic wave resonator.

The parallel-arm resonator unit P1 includes a first end connected to a node between the series-arm resonator unit S1 and the series-arm resonator unit S2, and includes a second end connected to the ground potential GND via an inductor L1. The parallel-arm resonator unit P2 includes a first end connected to a node between the series-arm resonator unit S2 and the series-arm resonator unit S3, and includes a second end connected to the ground potential GND via the inductor L1 as in the parallel-arm resonator unit P1. The parallel-arm resonator unit P3 includes a first end connected to a node between the series-arm resonator unit S3 and the series-arm resonator unit S4, and includes a second end connected the ground potential GND via the inductor L1 as in the cases of the parallel-arm resonator units P1 and P2. The parallel-arm resonator unit P4 includes a first end connected to a node between the series-arm resonator unit S4 and the series-arm resonator unit S5, and includes a second end connected to the ground potential GND via an inductor L2.

The reception filter 200 is a ladder filter connected between the antenna terminal T1 and a reception terminal T3. The filter 200 filters a signal received at the antenna ANT, and outputs the signal from the reception terminal T3. The filter 200 allows signals in a pass band BW2 (second pass band) to pass therethrough. The pass band BW2 of the filter 200 is different from the pass band BW1 of the filter 100. The filter 200 is connected to the antenna terminal T1 via an impedance matching inductor L11.

The filter 200 includes a series-arm circuit including series-arm resonator units S11 to S14 serially connected between the inductor L11 and the reception terminal T3, and a series-arm circuit including parallel-arm resonator units P11 to P14 connected between the series-arm circuit and the ground potential GND. Each of the series-arm resonator units S11 to S14 and the parallel-arm resonator units P11 to P14 includes at least one acoustic wave resonator. As in the case of the filter 100, also in the filter 200, the number of acoustic wave resonators included in each resonator unit is not limited to the case in FIG. 1, and may be appropriately selected in accordance with the characteristics of the filter. For example, a SAW resonator or a BAW resonator may be used as each acoustic wave resonator.

The parallel-arm resonator unit P11 includes a first end connected to a node between the inductor L11 and the series-arm resonator unit S11, and includes a second end connected to the ground potential GND. The parallel-arm resonator unit P12 includes a first end connected to a node between the series-arm resonator unit S11 and the series-arm resonator unit S12, and includes a second end connected to the ground potential GND. The parallel-arm resonator unit P13 includes a first end connected to a node between the series-arm resonator unit S12 and the series-arm resonator unit S13, and includes a second end connected to the ground potential GND. The parallel-arm resonator unit P14 includes a first end connected to a node between the series-arm resonator unit S13 and the series-arm resonator unit S14, and includes a second end connected to the ground potential GND.

The filter 100 corresponds to a "first filter", and the filter 200 corresponds to a "second filter".

Figure 2:
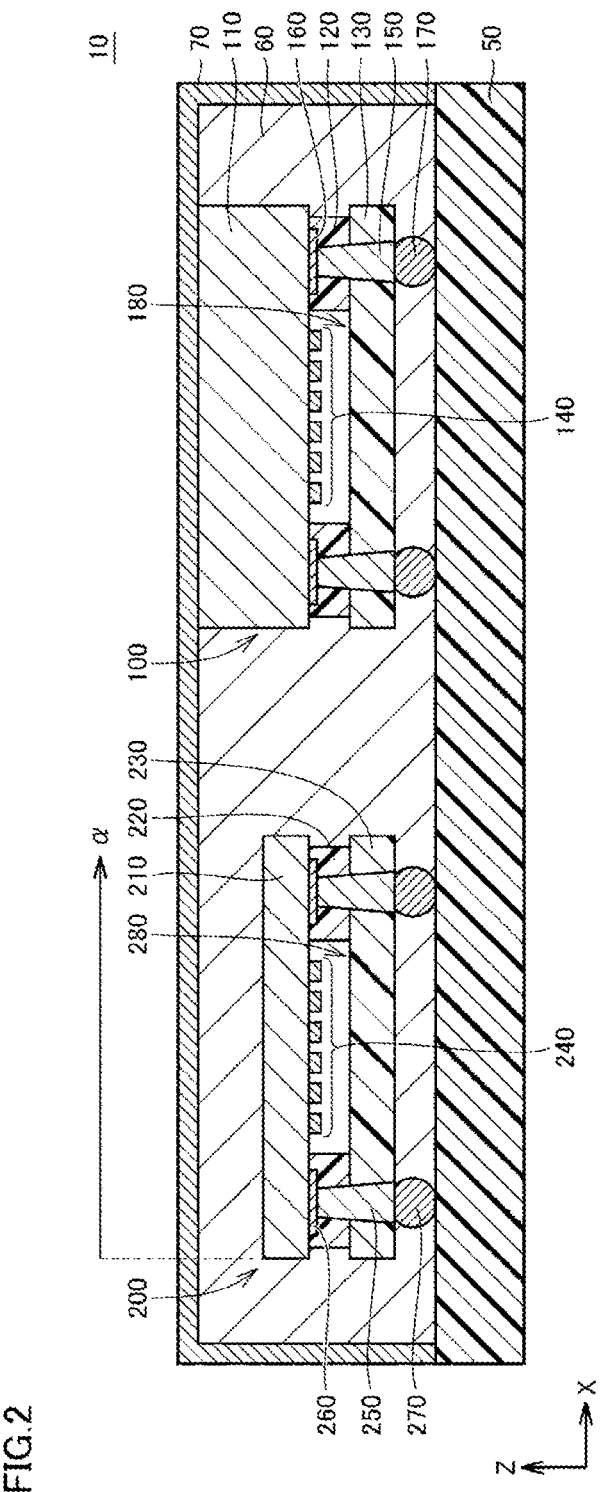
FIG. 2 is cross-sectional view of a multiplexer in FIG. 1.

FIG. 2 is a cross-sectional view of the multiplexer 10 in FIG. 1. With reference to FIG. 2, the multiplexer 10 includes, in addition to the filters 100 and 200, a mount board 50, a resin layer 60, and an electrically conductive layer 70. An example where the filters 100 and 200 include SAW resonators used as acoustic resonators is described as an example, below.

The filters 100 and 200 have a wafer level package (WLP) structure, and are mounted on the mount board 50 while being adjacent to each other. In the description below, a thickness direction of the mount board 50 is defined as a Z-axis, and, in an in-plane direction of the mount board 50, a direction in which the filters 100 and 200 are adjacent to each other is defined as an X-axis direction. In the example in FIG. 2, the filter 100 is spaced apart from the filter 200 in a positive X-axis direction. A positive Z-axis direction may be referred to as a direction toward an upper surface, and a negative Z-axis direction may be referred to as a direction toward a lower surface.

The mount board 50 is, for example, a monolayer or multilayer board made of resin such as epoxy or polyimide. Although not illustrated, the mount board 50 includes connection terminals provided on the upper surface and the lower surface, and a wiring pattern provided in the board and/or on the surface of the board.

The filter 100 includes a piezoelectric substrate 110, a support layer 120, a cover layer 130, a functional device 140, a columnar electrode 150, and a wiring pattern 160.

Figure 3:
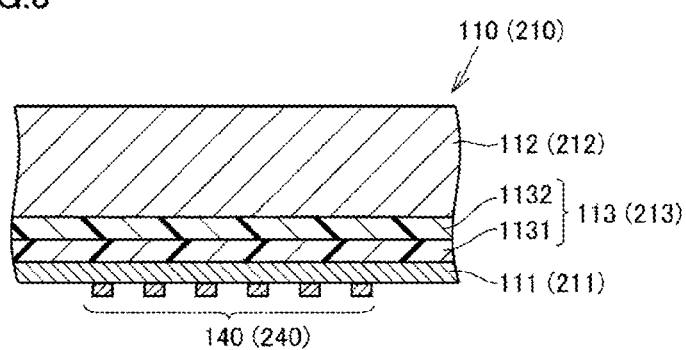
FIG. 3 is a diagram describing a piezoelectric substrate in detail.

As illustrated in FIG. 3, the piezoelectric substrate 110 includes a base board 112, a piezoelectric layer 111 disposed on the lower surface of the base board 112, and an intermediate layer 113 disposed between the piezoelectric layer 111 and the base board 112.

The piezoelectric layer 111 is made of, for example, a piezoelectric single-crystal material such as lithium tantalate (LiTaO$_3$ or LT), lithium niobate (LiNbO$_3$ or LN), alumina, silicon (Si), or sapphire, or a piezoelectric layered material including LiTaO$_3$ or LiNbO$_3$. The base board 112 is made of, for example, silicon (Si), lithium tantalate (LT), or lithium niobate (LN).

The intermediate layer 113 includes a low-velocity layer 1131 and a high-velocity layer 1132. The low-velocity layer 1131 and the high-velocity layer 1132 are arranged in order of the high-velocity layer 1132 and the low-velocity layer 1131 from adjacent to the base board 112 towards the piezoelectric layer 111.

The low-velocity layer 1131 is made of a material that allows a bulk wave to propagate therethrough at a lower velocity than a bulk wave that propagates through the piezoelectric layer 111. The low-velocity layer 1131 is made of, for example, a dielectric such as a silicon dioxide (SiO$_2$), glass, a silicon oxynitride, or a tantalum oxide, or a compound obtained by adding fluorine, carbon, or boron to a silicon dioxide.

The high-velocity layer 1132 is made of a material that allows a bulk wave to propagate therethrough at a higher velocity than an acoustic wave that propagates through the piezoelectric layer 111. The high-velocity layer 1132 is made of, for example, a material such as a silicon nitride (SiN), an aluminum nitride, an aluminum oxide (alumina), a silicon oxynitride, a silicon carbide, diamond-like carbon (DLC), or diamond.

When the low-velocity layer 1131 and the high-velocity layer 1132 are disposed between the piezoelectric layer 111 and the base board 112, the low-velocity layer 1131 and the high-velocity layer 1132 define and function as a reflecting layer (a mirror layer). Specifically, a surface acoustic wave that leaks from the piezoelectric layer 111 towards the base board 112 is reflected by the high-velocity layer 1132 due to the difference in propagation velocity, and confined in the low-velocity layer 1131. Thus, the intermediate layer 113 reduces a loss of acoustic energy of the propagated surface acoustic wave, and thus can efficiently propagate the surface acoustic wave.

Although FIG. 3 illustrates a case where the low-velocity layer 1131 and the high-velocity layer 1132 in the intermediate layer 113 are single layers, the intermediate layer 113 may include multiple low-velocity layers 1131 and multiple high-velocity layers 1132 disposed alternately with each other. The intermediate layer 113 may be omitted, and the piezoelectric substrate 110 may simply include the piezoelectric layer 111 and the base board 112.

The at least one functional device 140 is provided on the lower surface of the piezoelectric layer 111 of the piezoelectric substrate 110. The functional device 140 includes a pair of interdigital transducer (IDT) electrodes made of an electrode material, for example, a single metal formed from at least one of aluminum, copper, silver, gold, titanium, tungsten, platinum, chromium, nickel, and molybdenum, or an alloy mainly including these metals. In the filter 100, the piezoelectric substrate 110 and the IDT electrode form a surface acoustic wave (SAW) resonator.

The support layer 120 is disposed on the lower surface of the piezoelectric substrate 110 and surrounds the periphery of the functional device 140. The support layer 120 supports the cover layer 130 at a predetermined distance apart from the piezoelectric substrate 110 in the Z-axis direction. The support layer 120 and the cover layer 130 are made of an insulating resin mainly including, for example, epoxy, polyimide, acryl, or polyurethane. The piezoelectric substrate 110, the support layer 120, and the cover layer 130 define a hollow space 180. The functional device 140 is disposed in the hollow space 180.

The wiring pattern 160 is formed on the lower surface of the piezoelectric substrate 110 to electrically connect the functional devices 140 to each other, and to electrically connect the functional devices 140 and the columnar electrode 150 (via) to each other.

The columnar electrode 150 protrudes downward (negative Z-axis direction) from the lower surface of the piezoelectric substrate 110, and extends through the support layer 120 and the cover layer 130. The columnar electrode 150 is connected to a connection terminal provided on the mount board 50 via an electrically conductive connector such as a solder bump 170, for example. The columnar electrode 150 can electrically connect the functional device 140 and other electronic components on the mount board 50 to each other. The columnar electrode 150 and the wiring pattern 160 are made of, for example, an electrically conductive material such as aluminum, copper, silver, or gold.

The filter 200 has the same or substantially the same structure as the filter 100, and includes a piezoelectric substrate 210, a support layer 220, a cover layer 230, a functional device 240, a columnar electrode 250, and a wiring pattern 260. The functional device 240 is provided in a hollow space 280 defined by the piezoelectric substrate 210, the support layer 220, and the cover layer 230. The filter 200 is connected to the mount board 50 via an electrically conductive connector such as a solder bump 270, for example. The piezoelectric substrate 210 of the filter 200 includes a piezoelectric layer 211, a base board 212, and an intermediate layer 213. Components in the filter 200 are the same or substantially the same as the corresponding components in the filter 100, and thus are not repeatedly described in detail.

The filters 100 and 200 mounted on the mount board 50 are sealed with the resin layer 60. The resin layer 60 is made of, for example, a material obtained by mixing an inorganic filler such as metal into a material such as silicon compound, epoxy resin, silicone resin, fluorine resin, or acrylic resin. The electrically conductive layer 70 is disposed to cover the resin layer 60.

The electrically conductive layer 70 is made of, for example, a metal material having electric conductivity and high heat conductivity, such as aluminum, copper, silver, or gold. The electrically conductive layer 70 is connected to the ground potential at the mount board 50. The electrically conductive layer 70 defines and functions as a shield to block leakage of electromagnetic noise generated in the multiplexer 10 to the outside of the device, and to block intrusion of electromagnetic noise into the multiplexer 10 from outside the device.

As illustrated in FIG. 1, in the multiplexer 10 according to the first preferred embodiment, the filter 100 is used as a transmission filter, and the filter 200 is used as a reception filter. Transmission signals are generally transmitted using a power amplifier with power higher than the power used for reception signals to radiate radio waves as far as possible. Thus, the filter 100 consumes more power than the filter 200, and generates more heat than the filter 200.

Therefore, in the multiplexer 10, the upper surface of the piezoelectric substrate 110 in the filter 100 is exposed through the resin layer 60 to be in direct contact with the electrically conductive layer 70. As described above, the electrically conductive layer 70 is made of a metal material with high heat conductivity. Thus, the electrically conductive layer 70 defines and functions as a heat sink of the filter 100, and the electrically conductive layer 70 dissipates and radiates heat generated at the filter 100.

Figure 4:
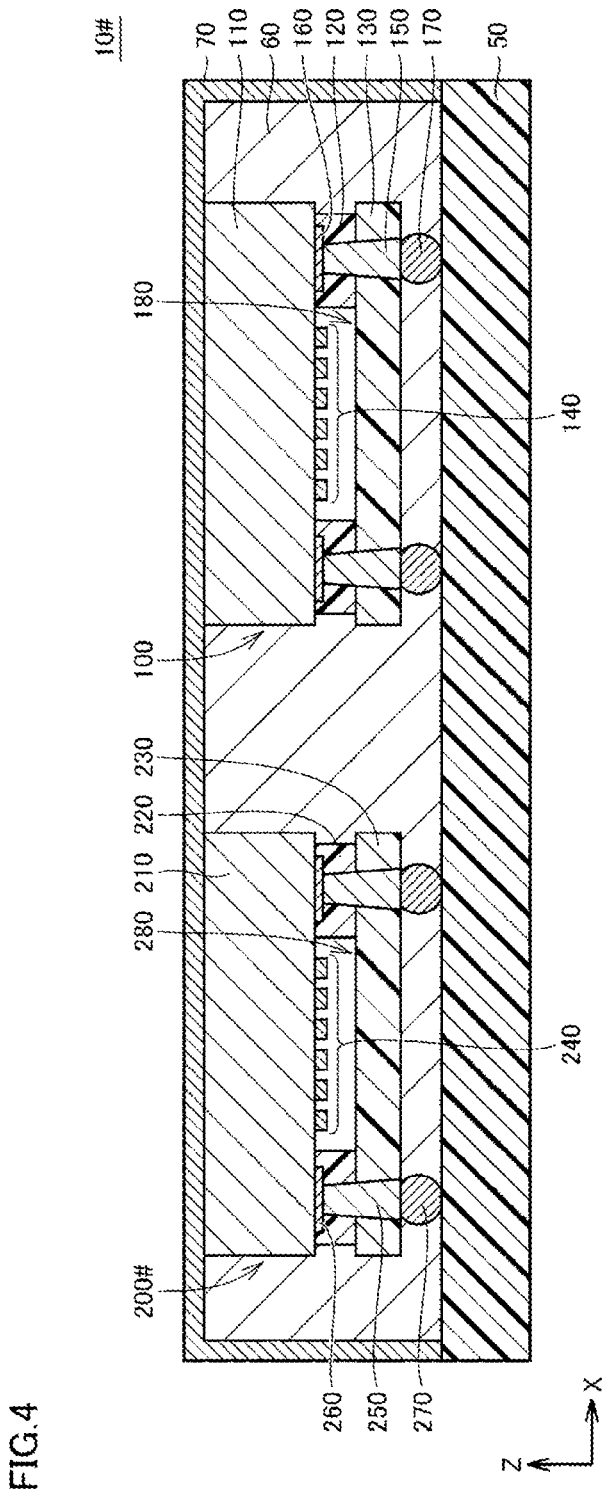
FIG. 4 is a cross-sectional view of a multiplexer according to a comparative example.

On the other hand, in the multiplexer 10 according to the first preferred embodiment, the piezoelectric substrate 210 of the filter 200 is thinner than the piezoelectric substrate 110 of the filter 100, and not in contact with the electrically conductive layer 70. As described above, the electrically conductive layer 70 defines and functions as a heat sink of the filter 100, and has high heat conductivity. Thus, as in a multiplexer 10 # according to a comparative example in FIG. 4, when a piezoelectric substrate 210 # of a filter 200 # is disposed to be in contact with the electrically conductive layer 70, heat is transferred from the filter 100 to the filter 200 # via the electrically conductive layer 70. Thus, heat from the filter 100 may raise the temperature of the filter 200 #, and may degrade filter characteristics of the filter 200 #.

For example, depending on the material of the piezoelectric substrate, a temperature rise of the substrate may shift the pass band of the filter. When temperature characteristics of frequency (TCF) is positive (TCF>0), a temperature rise shifts the frequency band to higher frequencies. In contrast, when TCF is negative (TCF<0), a temperature rise shifts the frequency band to lower frequencies.

In a structure such as in a multiplexer where filters having different pass bands are arranged adjacent to each other, and the two pass bands are approximate to each other, a shift of the pass band of one of the filters toward the pass band of the other filter may lower the impedance between the filters and degrade isolation. This may degrade the filter insertion loss. In the present disclosure, an increase of a such loss that occurs between filters adjacent to each other is referred to as a "parallel-arrangement loss".

In the multiplexer 10 according to the first preferred embodiment, the transmission filter 100 that generates a relatively large amount of heat includes the piezoelectric substrate 110 that is thicker (greater in the dimension in the Z-axis direction) and in direct contact with the electrically conductive layer 70. Thus, the filter 100 improves the heat dissipation effect, and can reduce heat transferred via the resin layer 60. In addition, the reception filter 200 that generates a relatively small amount of heat includes the piezoelectric substrate 210 that is thinner and not in contact with the electrically conductive layer 70. Thus, the filter 200 reduces heat transferred via the electrically conductive layer 70. This structure reduces heat of the filter 100 transferred to the filter 200, and thus can reduce a parallel-arrangement loss resulting from the filter 100 and the filter 200 being arranged adjacent to each other.

Figure 5:
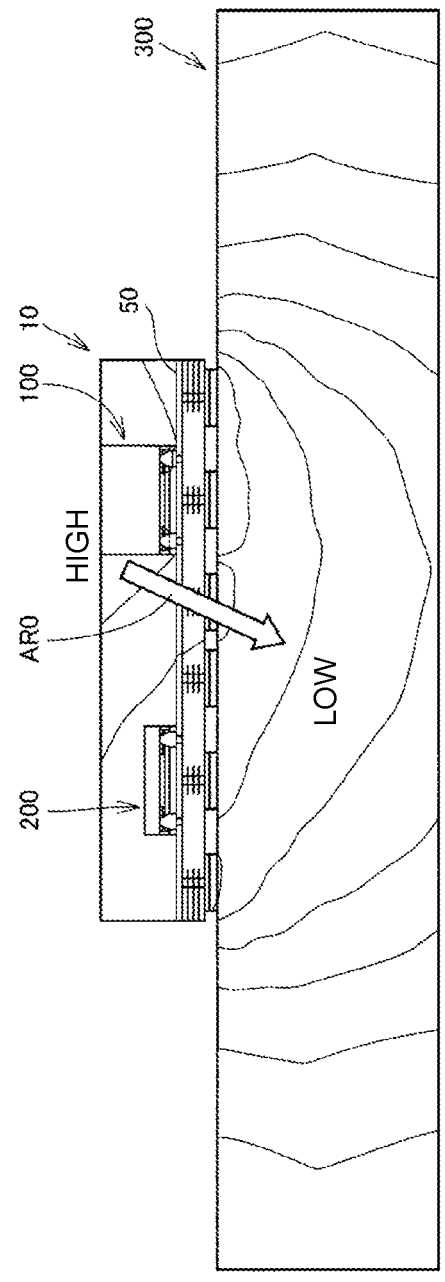
FIG. 5 is a diagram of an example of a temperature distribution map in the multiplexer illustrated in FIG. 1.

FIG. 5 is a diagram of an example of a temperature distribution map when the multiplexer 10 illustrated in FIG. 1 operates. In FIG. 5, the multiplexer 10 is disposed on a motherboard 300, and a temperature distribution is indicated with contour lines. In FIG. 5, the temperature is highest at the filter 100, and the temperature gradually lowers in a direction indicated with arrow AR0.

As illustrated in FIG. 5, the temperature at the upper surface of the resin layer 60 facing the filter 200 is raised by the electrically conductive layer 70 further than the temperature around the filter 200. FIG. 5 reveals that reduction of the thickness of the piezoelectric substrate 210 of the filter 200 reduces heat transferred to the piezoelectric substrate 210 via the electrically conductive layer 70.

Figure 6:
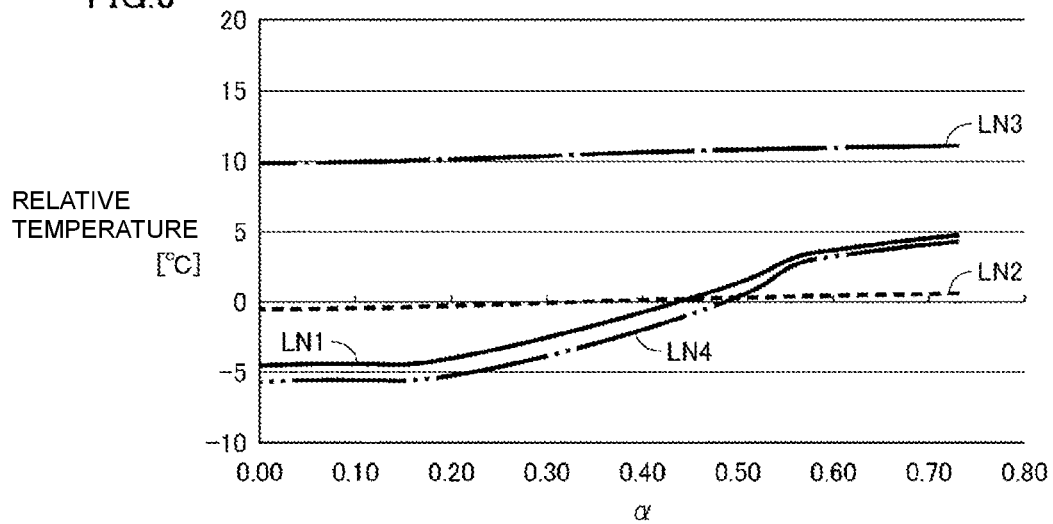
FIG. 6 is a graph illustrating effects of the materials of piezoelectric substrates and the contact state between the piezoelectric substrates and an electrically conductive layer on the filter temperature.

FIG. 6 is a graph illustrating effects of the difference between the material of the piezoelectric substrates 110 and 210 and the difference of the contact state between the piezoelectric substrates 110 and 210 and the electrically conductive layer 70 on the temperature of the filter 200. In FIG. 6, a solid line LN1 indicates a case where the material of the piezoelectric substrate 110 is silicon (Si), the material of the piezoelectric substrate 210 is lithium niobate (LN), and the piezoelectric substrate 210 is not in contact with the electrically conductive layer 70. A broken line LN2 indicates a case where the material of both the piezoelectric substrates 110 and 210 is silicon, and the piezoelectric substrate 210 is not in contact with the electrically conductive layer 70. A dot-and-dash line LN3 indicates a case where the material of the two piezoelectric substrates is silicon, and the piezoelectric substrate 210 is in contact with the electrically conductive layer 70 (that is, a case of a comparative example in FIG. 4). A two-dot chain line LN4 indicates a case where the material of both the piezoelectric substrates 110 and 210 is silicon, and the piezoelectric substrate 210 is not in contact with the electrically conductive layer 70.

In FIG. 6, an axis of abscissa indicates a distance in the X-axis direction from an outer end portion of the filter 200 (coordinate axis a in FIG. 2), and an axis of ordinate indicates a relative temperature difference with respect to the dot-and-dash line LN3.

With reference to FIG. 6, in the cases of the first preferred embodiment where the piezoelectric substrate 210 is not in contact with the electrically conductive layer 70 (lines LN1, LN2, and LN4), the temperature of the piezoelectric substrate 210 is lower than that in the comparative example (line LN3). When lithium niobate is used as the material of the piezoelectric substrate 210, the temperature gradient in the X-axis direction is greater than when silicon is used as the material of the piezoelectric substrate 210. Thus, when a material having a great thermal resistance value such as, for example, lithium niobate is used as the material of the piezoelectric substrate 210, and when the thickness of the piezoelectric substrate 210 is small, the characteristics of the piezoelectric substrate 210 may degrade also depending on the positions of the acoustic wave resonators in the piezoelectric substrate 210.

Effects of Heat on Filter Characteristics

Figure 7:
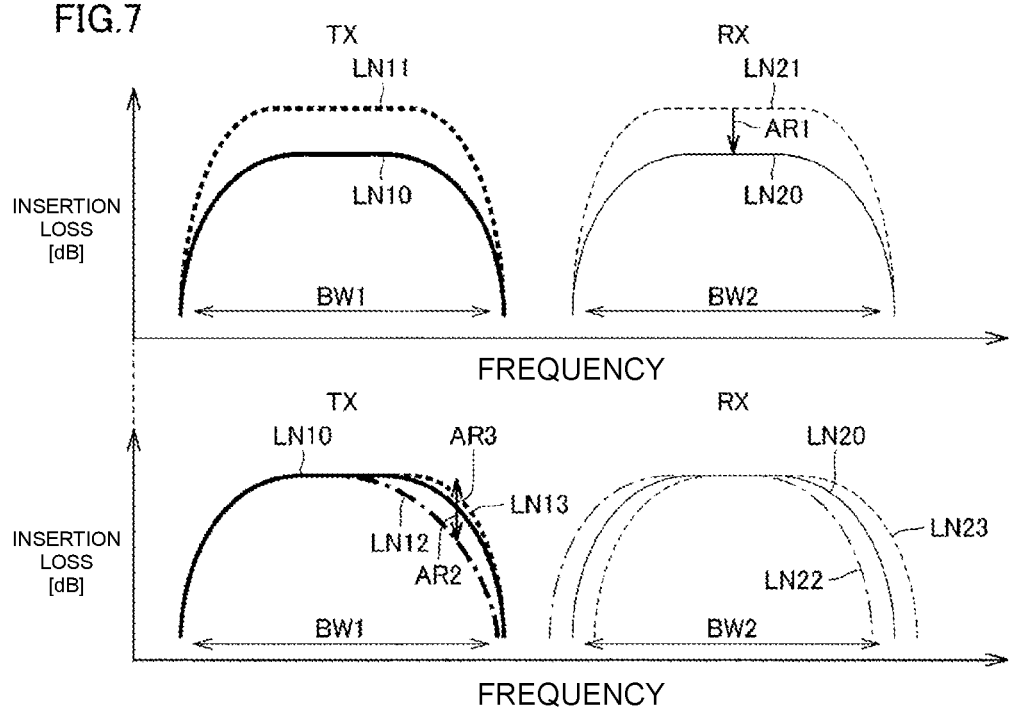
FIG. 7 is a graph describing a loss (parallel-arrangement loss) caused in filters adjacent to each other, changing in response to a temperature rise.

With reference to FIG. 7, the reason why a loss caused in adjacent filters (parallel-arrangement loss) changes in response to a temperature rise is described. In FIG. 6, a case where the pass band BW1 of the transmission filter 100 (TX) is lower than the pass band BW2 of the reception filter 200 (RX) (BW1<BW2) is described as an example.

An upper section in FIG. 7 is a graph comparing insertion losses (broken lines LN11 and LN21) of the filters 100 and 200 defined by single bodies and insertion losses (solid lines LN10 and LN20) of the filters 100 and 200 built in the multiplexer 10. As illustrated in the upper section in FIG. 7, when the filters 100 and 200 are connected to the common terminal as a multiplexer, insertion losses (parallel-arrangement losses) of both filters increase (arrow AR1). The parallel-arrangement losses are caused because the impedance of the adjacent filter cannot be completely infinite when viewed from the common terminal, and thus a subset of transmission signals leaks to the reception filter 200 or a subset of reception signals leaks to the transmission filter 100.

In this state, when the temperature of the filter 200 rises, the pass band BW2 of the filter 200 may change due to the temperature characteristics of the filter 200. For example, when the pass band BW2 of the filter 200 lowers in response to a temperature rise (TCF<0) (dot-and-dash line LN22), the pass band of the filter 200 becomes closer to the pass band BW1 of the filter 100. Thus, isolation between the filter 100 and the filter 200 degrades, and the insertion loss of the filter 100 in the higher frequencies increases as indicated with an arrow AR2 (dot-and-dash line LN12). Specifically, the temperature rise of the filter 200 increases the parallel-arrangement loss.

On the other hand, when the pass band BW2 of the filter 200 rises in response to a temperature rise (TCF>0) (dot-and-dash line LN23), the pass band BW2 of the filter 200 is spaced further apart from the pass band BW1 of the filter 100. In this case, isolation between the filter 100 and the filter 200 is improved, and thus the insertion loss of the filter 100 in the higher frequencies decreases as indicated with an arrow AR3 (broken line LN13). Specifically, when TCF>0, the parallel-arrangement loss decreases in response to a temperature rise.

Conversely, when the pass band BW1 of the filter 100 is higher than the pass band BW2 of the filter 200 (BW1>BW2), the parallel-arrangement loss decreases in response to a temperature rise when TCF<0, and the parallel-arrangement loss increases in response to a temperature rise when TCF>0.

Hereafter, four cases that differ in the width relationship and TCF between the pass bands of the filters 100 and 200 are described in detail in relation to a change of a parallel-arrangement loss in response to a temperature rise and an arrangement of the corresponding acoustic wave resonators.

Case 1

Figure 8:
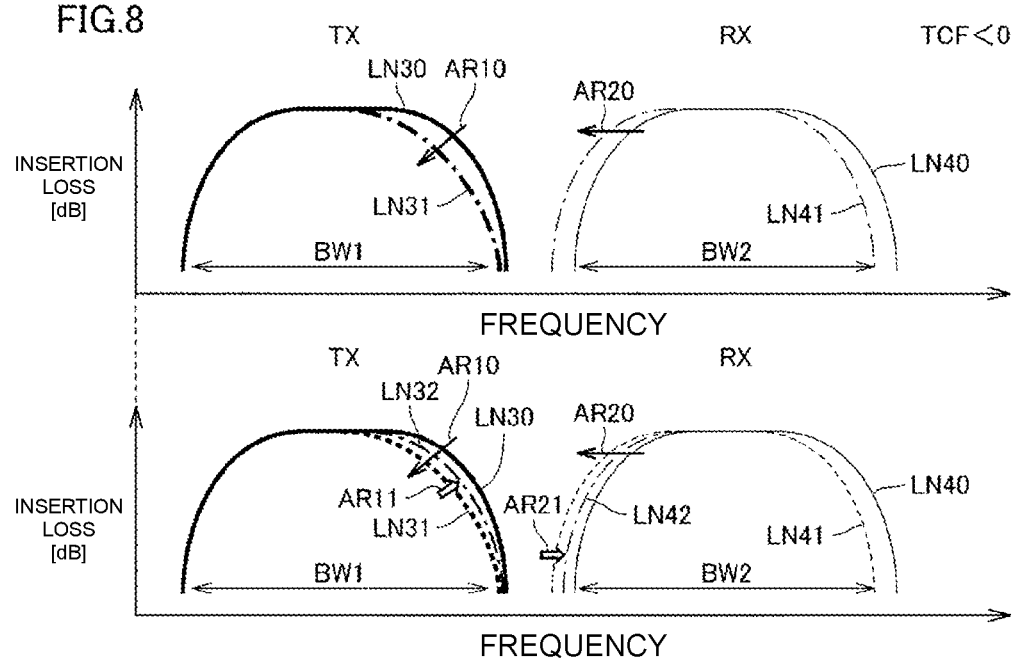
FIG. 8 is a graph describing a parallel-arrangement loss in case 1.

FIG. 8 is a diagram describing a parallel-arrangement loss in case 1. Case 1 is a case where the pass band BW1 of the filter 100 is lower than the pass band BW2 of the filter 200 (BW1<BW2), and the pass band BW2 of the filter 200 lowers together in response to a temperature rise (TCF<0).

In this case, as illustrated in the upper section in FIG. 8, the pass band BW2 of the filter 200 shifts to lower frequencies from a solid line LN40 to a broken line LN41 (arrow AR20). Thus, the insertion loss of the filter 100 in higher frequencies increases from a solid line LN30 to a broken line LN31 (arrow AR10).

As illustrated in FIG. 1, the filter 200 is a ladder filter, for example. Thus, generally, attenuation poles in lower frequencies are provided by the parallel-arm resonator units P1 to P4. Thus, in case 1, to reduce an increase of the parallel-arrangement loss in response to a temperature rise, temperature rises of the parallel-arm resonator units are preferably reduced as much as possible, and attenuation poles of the pass band BW2 in lower frequencies are preferably shifted to higher frequencies. Thus, in case 1, as illustrated in FIG. 9, in the filter 200, the parallel-arm resonator units P1 to P4 are spaced away from the filter 100 to reduce temperature rises of the parallel-arm resonator units P1 to P4.

Figure 9:
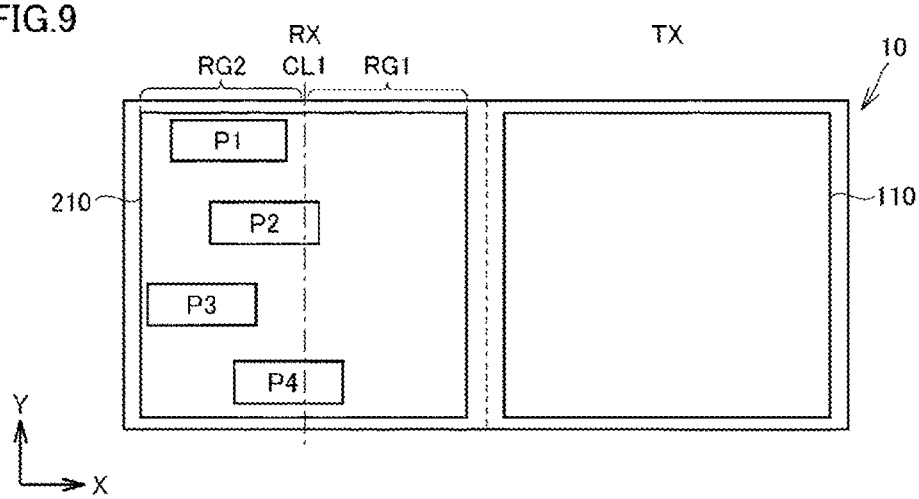
FIG. 9 is a diagram describing an arrangement of parallel-arm resonator units in case 1.

As illustrated in FIG. 9, in the filter 200, with respect to a virtual line CL1 that is perpendicular or substantially perpendicular to a direction in which the filters 100 and 200 are arranged, that is, perpendicular or substantially perpendicular to the X-axis direction (first direction) and that passes through the center of the piezoelectric substrate 210 of the filter 200, a region closer to the filter 100 is defined as a region RG1, and a region farther from the filter 100 is defined as a region RG2. At this time, the parallel-arm resonator units P1 to P4 are arranged to allow a sum total SM2 of the areas within the region RG2 where the acoustic wave resonators included in the parallel-arm resonator units P1 to P4 are provided to be greater than a sum total SM1 of the areas within the region RG1 where the acoustic wave resonators included in the parallel-arm resonator units P1 to P4 are provided (SM1<SM2).

When the parallel-arm resonator units P1 to P4 are arranged in this manner, as illustrated in the lower section in FIG. 8, lower frequencies in the pass band BW2 of the filter 200 shift to higher frequencies as indicated with a dot-and-dash line LN42 (arrow AR21). Thus, isolation between the filter 100 and the filter 200 is improved, and an insertion loss of the pass band BW1 of the filter 100 in higher frequencies can be reduced as indicated with a dot-and-dash line LN32 (arrow AR11).

Figure 10A:
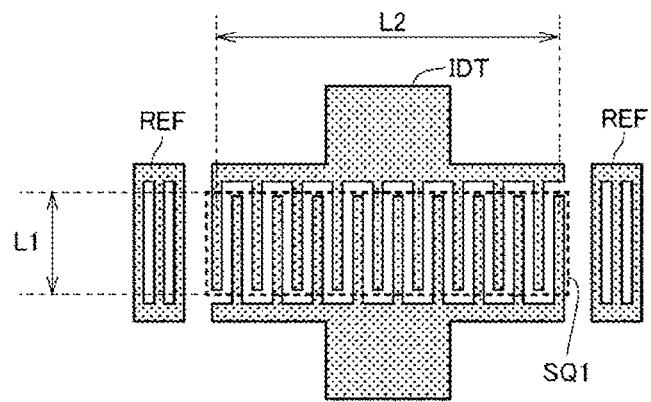
FIGS. 10A and 10B are diagrams describing areas of regions in which acoustic wave resonators are provided.

In the above and the following description, as illustrated in FIG. 10A, "the area of a region where each acoustic wave resonator is provided" indicates the area of a cross region SQ1 of electrode fingers in the IDT electrode IDT included in the acoustic wave resonator. Here, the cross region refers to an area where the multiple electrode fingers included in the IDT electrode overlap when the IDT electrode is viewed from a propagation direction of the acoustic wave. For example, in FIG. 10A, when the IDT electrode is viewed in the propagation direction of the acoustic wave, the area of the cross region is expressed by a product of L1 and L2 where L1 denotes the length in which the electrode fingers extend, and L2 denotes the distance between the outermost electrode fingers in the IDT electrode in the area where the multiple electrode fingers overlap.

Figure 10B:
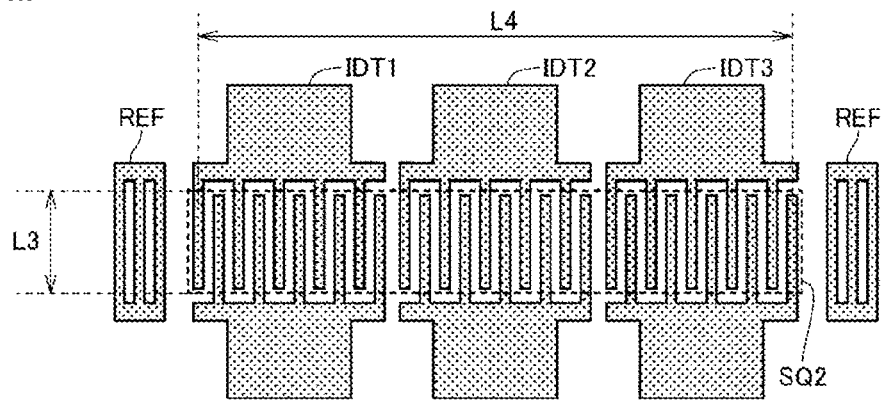

In the case of a longitudinally coupled resonator, the area of the cross region refers to the area of the cross region SQ2 in FIG. 10B. The cross region in this case indicates an area where multiple electrode fingers included in the IDT electrodes IDT1 to IDT3 of the longitudinally coupled resonator overlap. For example, in FIG. 10B, when the IDT electrodes IDT1 to IDT3 are viewed in the propagation direction of the acoustic waves, the area of the cross region is expressed by a product of L3 and L4 where L3 denotes the length in which the electrode fingers extend, and L4 denotes the distance between the outermost electrode fingers in the IDT electrodes of the longitudinally coupled resonator in the area where the multiple electrode fingers overlap.

Case 2

Figure 11:
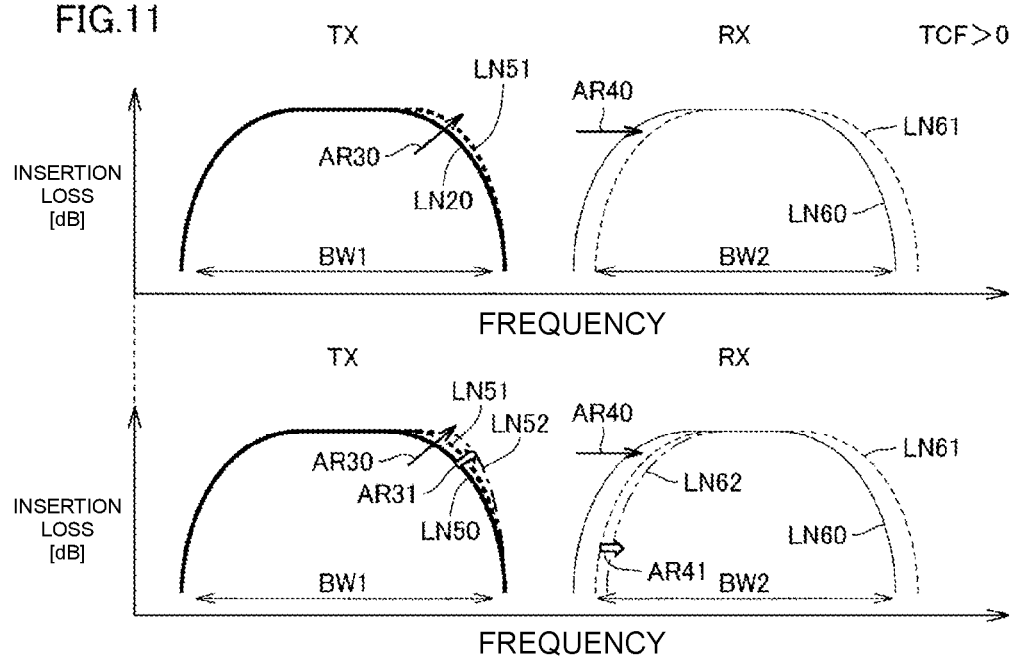
FIG. 11 is a graph describing a parallel-arrangement loss in case 2.

FIG. 11 is a diagram describing a parallel-arrangement loss in case 2. Case 2 is a case where the pass band BW1 of the filter 100 is lower than the pass band BW2 of the filter 200 (BW1<BW2) and the pass band BW2 of the filter 200 shifts higher together in response to a temperature rise (TCF>0). Specifically, in case 2, a temperature rise of the filter 200 expands a gap between the pass band of the filter 100 and the pass band of the filter 200, and thus improves isolation.

In this case, as illustrated in the upper section in FIG. 11, the pass band BW2 of the filter 200 shifts to higher frequencies from a solid line LN60 to a broken line LN61 (arrow AR40). Thus, the insertion loss of the filter 100 in higher frequencies decreases from a solid line LN50 to a broken line LN51 (arrow AR30).

As described also in case 1, in the ladder filter 200, attenuation poles of the lower frequencies are provided by the parallel-arm resonator units P1 to P4. In case 2, a temperature rise of the filter 200 reduces the parallel-arrangement loss. Thus, the temperatures of the parallel-arm resonator units are preferably raised as much as possible to shift the attenuation poles of the lower frequencies in the pass band BW2 to further higher frequencies. Thus, in case 2, as illustrated in FIG. 12, the parallel-arm resonator units P1 to P4 in the filter 200 are arranged near the filter 100 to promote temperature rises of the parallel-arm resonator units P1 to P4.

Figure 12:
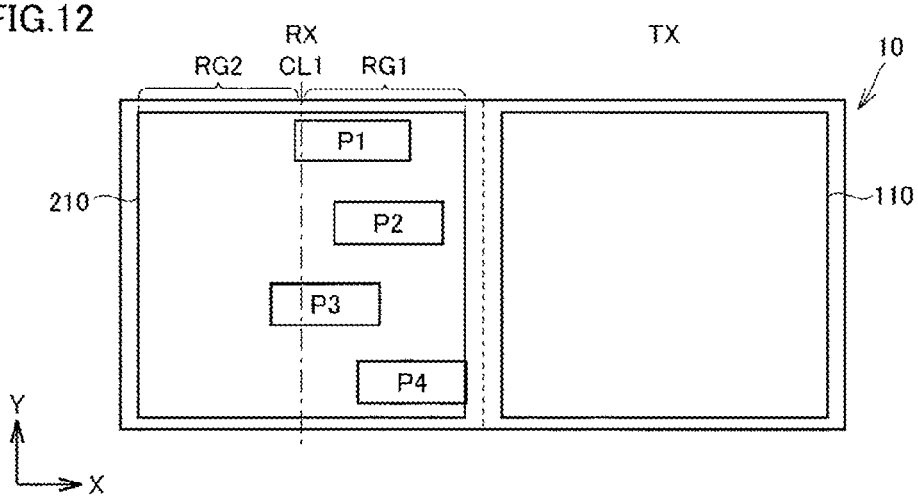
FIG. 12 is a diagram describing an arrangement of parallel-arm resonator units in case 2.

Specifically, as in FIG. 12, in the filter 200, the parallel-arm resonator units P1 to P4 are arranged to allow a sum total SM1 of the areas within the region RG1 where the acoustic wave resonators included in the parallel-arm resonator units P1 to P4 are greater than a sum total SM2 of the areas within the region RG2 where the acoustic wave resonators included in the parallel-arm resonator units P1 to P4 are provided (SM1>SM2).

As illustrated in the lower section in FIG. 11, when the parallel-arm resonator units P1 to P4 are arranged in this manner, the lower frequencies in the pass band BW2 of the filter 200 shift to further higher frequencies as indicated with a dot-and-dash line LN62 (arrow AR41). Thus, isolation between the filter 100 and the filter 200 is further improved, and the insertion loss of the pass band BW1 of the filter 100 in higher frequencies can be further improved as indicated with a dot-and-dash line LN52 (arrow AR31).

Case 3

Figure 13:
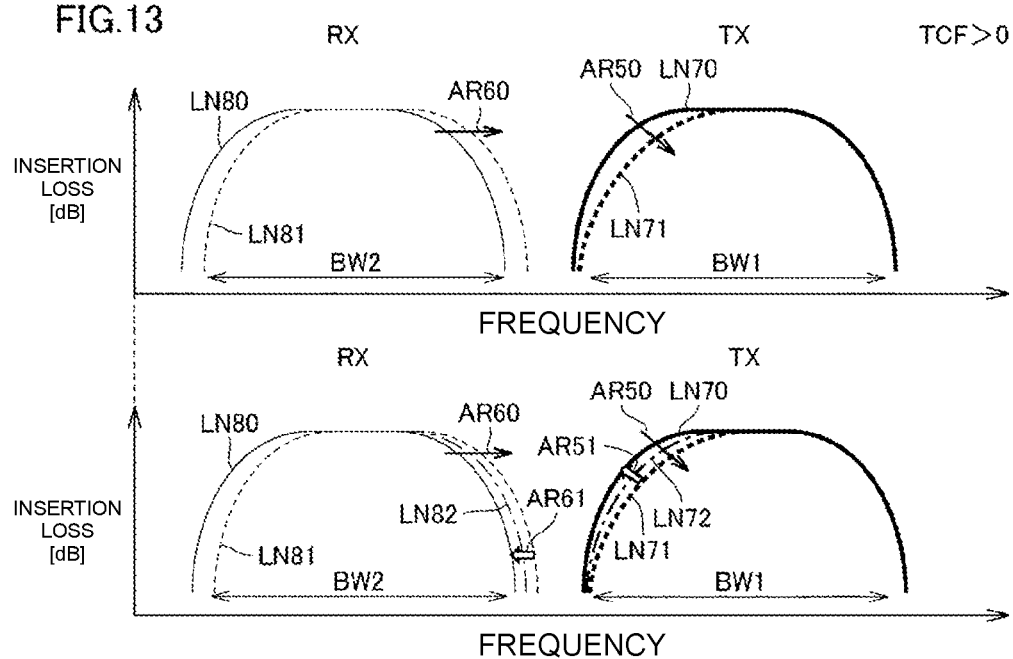
FIG. 13 is a diagram describing a parallel-arrangement loss in case 3.

FIG. 13 is a diagram describing a parallel-arrangement loss in case 3. Case 3 is a case where the pass band BW1 of the filter 100 is higher than the pass band BW2 of the filter 200 (BW1>BW2), and the pass band BW2 of the filter 200 shifts higher together with a temperature rise (TCF>0). Specifically, in case 3, a temperature rise of the filter 200 reduces a gap between the pass band of the filter 100 and the pass band of the filter 200, and thus degrades isolation.

In this case, as illustrated in the upper section in FIG. 13, the pass band BW2 of the filter 200 shifts to higher frequencies from a solid line LN80 to a broken line LN81 (arrow AR60). Thus, an insertion loss of the filter 100 in lower frequencies increases from a solid line LN70 to a broken line LN71 (arrow AR50).

In the ladder filter 200, attenuation poles of the higher frequencies are generally provided by the series-arm resonator units S1 to S5. In case 3, a temperature rise of the filter 200 increases the parallel-arrangement loss. Thus, temperature rises of the series-arm resonator units are preferably reduced as much as possible, and the attenuation poles of the higher frequencies in the pass band BW2 are preferably shifted to lower frequencies. Thus, in case 3, as illustrated in FIG. 14, the series-arm resonator units S1 to S5 in the filter 200 are spaced away from the filter 100 to reduce temperature rises of the series-arm resonator units S1 to S5.

Figure 14:
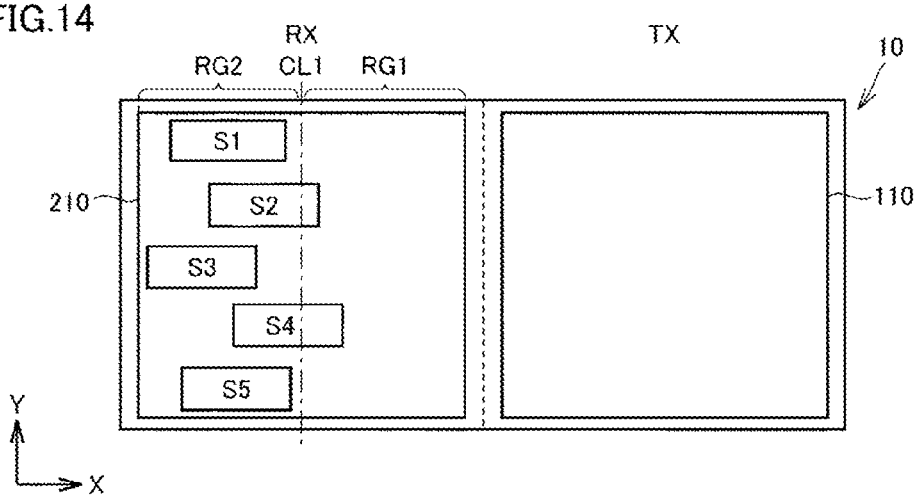
FIG. 14 is a diagram describing an arrangement of series-arm resonator units in case 3.

Specifically, as illustrated in FIG. 14, in the filter 200, the series-arm resonator units S1 to S5 are arranged to allow a sum total SM4 of the areas within the region RG2 where the acoustic wave resonators included in the series-arm resonator units S1 to S5 are greater than a sum total SM3 of the areas within the region RG1 where the acoustic wave resonators included in the series-arm resonator units S1 to S5 are provided (SM3<SM4).

When the series-arm resonator units S1 to S5 are arranged in this manner, as illustrated in the lower section in FIG. 13, higher frequencies in the pass band BW2 of the filter 200 shift to lower frequencies as indicated with a dot-and-dash line LN82 (arrow AR61). Thus, isolation between the filter 100 and the filter 200 is improved, and the insertion loss of the pass band BW1 of the filter 100 in lower frequencies can be improved as indicated with a dot-and-dash line LN72 (arrow AR51).

Case 4

FIG. 15 is a diagram describing a parallel-arrangement loss in case 4. Case 4 is a case where the pass band BW1 of the filter 100 is higher than the pass band BW2 of the filter 200 (BW1>BW2) and the pass band BW2 of the filter 200 lowers together with a temperature rise (TCF<0). Specifically, in case 4, a temperature rise of the filter 200 expands a gap between the pass band of the filter 100 and the pass band of the filter 200, and thus improves isolation.

In this case, as illustrated in the upper section in FIG. 15, the pass band BW2 of the filter 200 shifts to lower frequencies from a solid line LN100 to a broken line LN101 (arrow AR80). Thus, the insertion loss of the filter 100 in lower frequencies decreases from a solid line LN90 to a broken line LN91 (arrow AR70).

As described also in case 3, in the ladder filter 200, attenuation poles of the higher frequencies are provided by the series-arm resonator units S1 to S5. In case 4, a temperature rise of the filter 200 reduces the parallel-arrangement loss. Thus, the temperatures of the series-arm resonator units are preferably raised as much as possible to shift the attenuation poles of the higher frequencies in the pass band BW2 to further lower frequencies. Thus, in case 4, as illustrated in FIG. 16, the series-arm resonator units S1 to S5 in the filter 200 are arranged near the filter 100 to promote temperature rises of the series-arm resonator units S1 to S5.

Specifically, as illustrated in FIG. 16, in the filter 200, the series-arm resonator units S1 to S5 are arranged to allow a sum total SM3 of the areas within the region RG1 where the acoustic wave resonators included in the series-arm resonator units S1 to S5 are greater than a sum total SM4 of the areas within the region RG2 where the acoustic wave resonators included in the series-arm resonator units S1 to S5 are provided (SM3>SM4).

As illustrated in the lower section in FIG. 15, when the series-arm resonator units S1 to S5 are arranged in this manner, the higher frequencies in the pass band BW2 of the filter 200 shift to further lower frequencies as indicated with a dot-and-dash line LN102 (arrow AR81). Thus, isolation between the filter 100 and the filter 200 is further improved, and the insertion loss of the pass band BW1 of the filter 100 in higher frequencies can be further improved as indicated with a dot-and-dash line LN92 (arrow AR71).

As described above, in the multiplexer according to the first preferred embodiment, one (first filter) of the two filters disposed adjacent to each other with a relatively small thermal resistance value is brought into contact with the electrically conductive layer, and the other one (second filter) of the two filters disposed adjacent to each other with a relatively great thermal resistance value is not in contact with the electrically conductive layer to reduce heat transfer between the adjacent filters. In addition, in the second filter, based on the temperature characteristics of frequency (TCF), the acoustic wave resonators are arranged to space the attenuation poles in the second filter located approximate to the pass band of the first filter apart from the pass band of the first filter. Thus, the parallel-arrangement loss caused in the first filter can be reduced by using the temperature gradient provided in the piezoelectric substrate by the thermal resistance. Thus, the degradation of the characteristics of the multiplexer (acoustic wave device) due to heat can be reduced.

The first preferred embodiment has described a case where the transmission filter that generates a relatively large amount of heat is brought into contact with the electrically conductive layer. However, when the thermal resistance value of the transmission filter is greater than the thermal resistance value of the reception filter, the reception filter may be brought into contact with the electrically conductive layer, and the transmission filter may be not in contact with the electrically conductive layer.

The piezoelectric substrates in the two filters may be made of different materials or the same material (for example, silicon). In that case, the thermal resistance value is adjusted by varying the thicknesses of the piezoelectric substrates.

Instead of a combination of the transmission filter and the reception filter, both of the two filters may be transmission filters or reception filters as long as they have different pass bands. A combination of a transmission filter and a reception filter can be used as filters for a multiplexer, such as a pass band filter for transmitting signals between, for example, about 1710 MHz to about 1785 MHz and another pass band filter for receiving signals between, for example, about 1805 MHz to about 1880 MHz or a pass band filter for transmitting signals between, for example, about 2500 MHz to about 2570 MHz and another pass band filter for receiving signals between, for example, about 2620 MHz to about 2690 MHz. Two filters including transmission filters can be used as filters for a multiplexer, such as a pass band filter for transmitting signals between, for example, 1710 MHz to about 1785 MHz and another pass band filter for transmitting signals between, for example, about 1850 MHz to about 1915 MHz.

Second Preferred Embodiment

In the first preferred embodiment, the two filters included in the multiplexer are both ladder acoustic wave filters. A second preferred embodiment of the present invention describes a case where a reception filter is a longitudinally coupled acoustic wave filter including longitudinally coupled resonators.

Figure 17:
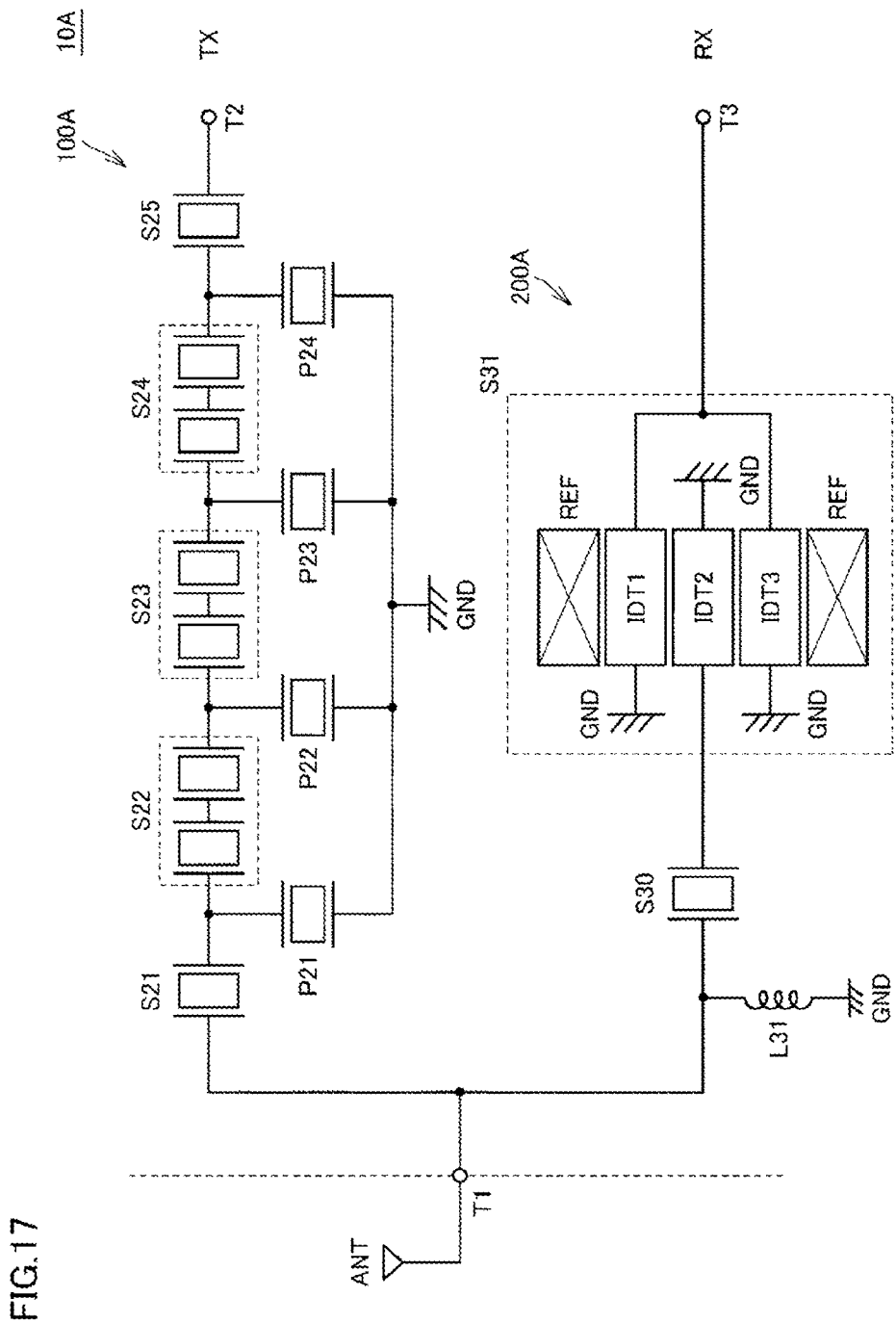
FIG. 17 is an example of a circuit configuration of a multiplexer according to a second preferred embodiment of the present invention.

FIG. 17 is a circuit configuration of a multiplexer 10A as an example of an acoustic wave device according to a second preferred embodiment of the present invention. With reference to FIG. 17, the multiplexer 10A includes an antenna terminal T1, and a transmission filter 100A and a reception filter 200A electrically connected to an antenna ANT at the antenna terminal T1.

The transmission filter 100A is a ladder acoustic wave filter including a series-arm circuit including series-arm resonator units S21 to S25 serially connected between the antenna terminal T1 and the transmission terminal T2, and a parallel-arm circuit including parallel-arm resonator units P21 to P24 connected between the series-arm circuit and the ground potential GND. Each of the series-arm resonator units S21 to S25 and the parallel-arm resonator units P21 to P24 includes at least one acoustic wave resonator. In the example in FIG. 17, each of the series-arm resonator units S21 and S25 and the parallel-arm resonator units P21 to P24 includes one acoustic wave resonator, and each of the series-arm resonator units S22 to S24 includes two acoustic wave resonators. The number of acoustic wave resonators included in each resonator unit is not limited to this case, and may be appropriately selected in accordance with the characteristics of the filter. For example, a SAW resonator or a BAW resonator may be used as the acoustic wave resonator.

The parallel-arm resonator unit P21 includes a first end connected to a node between the series-arm resonator unit S21 and the series-arm resonator unit S22, and includes a second end connected to the ground potential GND. The parallel-arm resonator unit P22 includes a first end connected to a node between the series-arm resonator unit S22 and the series-arm resonator unit S23, and includes a second end connected to the ground potential GND. The parallel-arm resonator unit P23 includes a first end connected to a node between the series-arm resonator unit S23 and the series-arm resonator unit S24, and includes a second end connected to the ground potential GND. The parallel-arm resonator unit P24 includes a first end connected to a node between the series-arm resonator unit S24 and the series-arm resonator unit S25, and includes a second end connected to the ground potential GND.

The reception filter 200A includes series-arm resonator units S30 and S31 and an inductor L31. The series-arm resonator unit S30 and the series-arm resonator unit S31 are serially connected between the antenna terminal T1 and the reception terminal T3.

The series-arm resonator unit S30 includes, for example, one acoustic wave resonator. The series-arm resonator unit S31 is a longitudinally coupled circuit including at least one longitudinally coupled resonator acoustic wave resonator. The series-arm resonator unit S31 includes three IDT electrodes IDT1 to IDT3 and two reflectors REF.

The series-arm resonator unit S30 includes a first end connected to an antenna terminal T1 defining and functioning as a common terminal used together with the filter 100A. The IDT electrode IDT2 of the series-arm resonator unit S31 is connected between the second end of the series-arm resonator unit S30 and the ground potential GND.

The IDT electrode IDT1 is disposed to face the first end of the IDT electrode IDT2 in the excitation direction, and the IDT electrode IDT3 is disposed to face the second end of the IDT electrode IDT2 in the excitation direction. The IDT electrode IDT1 and the IDT electrode IDT3 are connected in parallel between the reception terminal T3 and the ground potential GND. Reflectors REF are disposed to face the IDT electrodes IDT1 and IDT3 in the excitation direction opposite to the direction toward the IDT electrode IDT2.

The inductor L1 is connected between the antenna terminal T1 and the ground potential GND. The inductor L1 defines and functions as an impedance matching inductor. The inductance of the inductor L1 is adjusted so that the impedance becomes open for high-frequency signals in the pass band of the filter 100A when the filter 200A is viewed from the antenna terminal T1. This structure can reduce high-frequency signals in the pass band in the filter 100A that pass toward the reception terminal T3.

The cross-sectional view of the multiplexer 10A according to the second preferred embodiment is the same or substantially the same as FIG. 2. The functional device 240 in FIG. 2 defines and functions as a longitudinally coupled resonator.

Also in the multiplexer 10A, the transmission filter 100A that generates a relatively large amount of heat includes a piezoelectric substrate that is thicker and in direct contact with the electrically conductive layer. Thus, the filter 100A improves the heat dissipation effect, and can reduce heat transferred via the resin layer. In addition, the reception filter 200A that generates a relatively small amount of heat includes a piezoelectric substrate that is thinner and not in contact with the electrically conductive layer. Thus, the filter 200A reduces heat transferred via the electrically conductive layer. This structure reduces heat of the filter 100A transferred to the filter 200A, and thus can reduce a parallel-arrangement loss resulting from the filter 100A and the filter 200A being arranged adjacent to each other.

In the filter 200A, the attenuation poles of the higher frequencies in the pass band and the attenuation poles of the lower frequencies in the pass band are both determined by the longitudinally coupled resonators. Thus, the parallel-arrangement loss in cases 1 and 3 in the first preferred embodiment can be reduced and the insertion loss in cases 2 and 4 in the first preferred embodiment can be further improved by arranging the acoustic wave resonators included in the longitudinally coupled circuit in the manner as specified in each case.

More specifically, when the sum total of the areas within the region RG1 in FIG. 9 where the acoustic wave resonators included in the longitudinally coupled circuit in the filter 200A are provided is defined as SM5 and the sum total of the areas within the region RG2 in FIG. 9 where the acoustic wave resonators included in the longitudinally coupled circuit in the filter 200A are provided is defined as SM6, the longitudinally coupled resonators are arranged to allow the sum total SM6 of the areas within the region RG2 to be greater than the sum total SM5 of the areas within the region RG1 in cases 1 and 3 (SM5<SM6). In cases 2 and 4, the longitudinally coupled resonators are arranged to allow the sum total SM5 of the areas within the region RG1 to be greater than the sum total SM6 of the areas within the region RG2 (SM5>SM6).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
   a mount board;
   a first filter on the mount board and having a first pass band;
   a second filter on the mount board adjacent to the first filter in a first direction, and having a second pass band higher than the first pass band;
   a resin layer on the mount board and sealing the first filter and the second filter; and
   an electrically conductive layer covering the resin layer; wherein
   each of the first filter and the second filter includes:
     a piezoelectric substrate; and
     an acoustic wave resonator on the piezoelectric substrate;
   the first filter is in contact with the electrically conductive layer;
   the second filter is not in contact with the electrically conductive layer;
   the second filter is a ladder acoustic wave filter including at least one parallel-arm resonator and at least one series-arm resonator, or a longitudinally coupled acoustic wave filter including at least one longitudinally coupled resonator;
   a thermal resistance value of the piezoelectric substrate in the second filter in the first direction is greater than a thermal resistance value of the piezoelectric substrate in the first filter in the first direction;
   the second filter has characteristics to lower the second pass band in response to a temperature rise of the piezoelectric substrate of the second filter;
   with respect to a virtual line perpendicular or substantially perpendicular to the first direction and passing through a center of the piezoelectric substrate of the second filter, a region of the piezoelectric substrate closer to the first filter is defined as a first region, and a region of the piezoelectric substrate farther from the first filter is defined as a second region;
   all of the at least one parallel-arm resonator included in the ladder acoustic wave filter is defined as a parallel-arm circuit, all of the at least one series-arm resonator is defined as a series-arm circuit, and all of the at least one longitudinally coupled resonator included in the longitudinally coupled acoustic wave filter is defined as a longitudinally coupled circuit;
   areas in the first region and the second region where the acoustic wave resonator included in the parallel-arm circuit or the longitudinally coupled circuit is provided are defined as a first area and a second area; and
   the second area is greater than the first area.

2. The acoustic wave device according to claim 1, wherein the piezoelectric substrate of the first filter includes silicon.

3. The acoustic wave device according to claim 1, wherein the acoustic wave resonator included in the second filter includes an interdigital transducer electrode.

4. The acoustic wave device according to claim 1, wherein
   the acoustic wave device is a multiplexer including the first filter and the second filter connected to a common terminal;
   the first filter defines and functions as a transmission filter to transmit a signal through the common terminal; and
   the second filter defines and functions as a reception filter to receive a signal received at the common terminal.

5. The acoustic wave device according to claim 1, wherein the electrically conductive layer includes a metal material.

6. The acoustic wave device according to claim 5, wherein the electrically conductive layer is at a ground potential.

7. The acoustic wave device according to claim 1, wherein
   the second filter includes a cover layer between the piezoelectric substrate of the second filter and the mount board, and the piezoelectric substrate and the cover layer define a hollow space; and
   the acoustic wave resonator included in the second filter is on the piezoelectric substrate of the second filter in the hollow space.

8. An acoustic wave device, comprising:
   a mount board;
   a first filter on the mount board and having a first pass band;
   a second filter on the mount board adjacent to the first filter in a first direction, and having a second pass band higher than the first pass band;
   a resin layer on the mount board and sealing the first filter and the second filter; and
   an electrically conductive layer covering the resin layer; wherein
   each of the first filter and the second filter includes:
     a piezoelectric substrate; and
     an acoustic wave resonator on the piezoelectric substrate;
   the first filter is in contact with the electrically conductive layer;
   the second filter is not in contact with the electrically conductive layer;

the second filter is a ladder acoustic wave filter including at least one parallel-arm resonator and at least one series-arm resonator, or a longitudinally coupled acoustic wave filter including at least one longitudinally coupled resonator;
a thermal resistance value of the piezoelectric substrate in the second filter in the first direction is greater than a thermal resistance value of the piezoelectric substrate in the first filter in the first direction;
the second filter has characteristics to raise the second pass band in response to a temperature rise of the piezoelectric substrate of the second filter;
with respect to a virtual line perpendicular or substantially perpendicular to the first direction and passing through a center of the piezoelectric substrate of the second filter, a region of the piezoelectric substrate closer to the first filter is defined as a first region, and a region of the piezoelectric substrate opposite to the region closer to the first filter is defined as a second region;
all of the at least one parallel-arm resonator included in the ladder acoustic wave filter is defined as a parallel-arm circuit, all of the at least one series-arm resonator is defined as a series-arm circuit, and all of the at least one longitudinally coupled resonator included in the longitudinally coupled acoustic wave filter is defined as a longitudinally coupled circuit;
areas in the first region and the second region where the acoustic wave resonator included in the parallel-arm circuit or the longitudinally coupled circuit is provided are defined as a first area and a second area; and
the first area is greater than the second area.

9. The acoustic wave device according to claim 8, wherein the piezoelectric substrate of the first filter includes silicon.

10. The acoustic wave device according to claim 8, wherein the acoustic wave resonator included in the second filter includes an interdigital transducer electrode.

11. The acoustic wave device according to claim 8, wherein
the acoustic wave device is a multiplexer including the first filter and the second filter connected to a common terminal;
the first filter defines and functions as a transmission filter to transmit a signal through the common terminal; and
the second filter defines and functions as a reception filter to receive a signal received at the common terminal.

12. The acoustic wave device according to claim 8, wherein the electrically conductive layer includes a metal material.

13. The acoustic wave device according to claim 12, wherein the electrically conductive layer is at a ground potential.

14. The acoustic wave device according to claim 8, wherein
the second filter includes a cover layer between the piezoelectric substrate of the second filter and the mount board, and the piezoelectric substrate and the cover layer define a hollow space; and
the acoustic wave resonator included in the second filter is on the piezoelectric substrate of the second filter in the hollow space.

15. An acoustic wave device, comprising:
a mount board;
a first filter on the mount board and having a first pass band;
a second filter on the mount board adjacent to the first filter in a first direction, and having a second pass band lower than the first pass band;
a resin layer on the mount board and sealing the first filter and the second filter; and
an electrically conductive layer covering the resin layer; wherein
each of the first filter and the second filter includes:
a piezoelectric substrate; and
an acoustic wave resonator on the piezoelectric substrate;
the first filter is in contact with the electrically conductive layer;
the second filter is not in contact with the electrically conductive layer;
the second filter is a ladder acoustic wave filter including at least one parallel-arm resonator and at least one series-arm resonator, or a longitudinally coupled acoustic wave filter including at least one longitudinally coupled resonator;
a thermal resistance value of the piezoelectric substrate in the second filter in the first direction is greater than a thermal resistance value of the piezoelectric substrate in the first filter in the first direction;
the second filter has characteristics to raise the second pass band in response to a temperature rise of the piezoelectric substrate of the second filter;
with respect to a virtual line perpendicular or substantially perpendicular to the first direction and passing through a center of the piezoelectric substrate of the second filter, a region of the piezoelectric substrate closer to the first filter is defined as a first region, and a region of the piezoelectric substrate opposite to the region closer to the first filter is defined as a second region;
all of the at least one parallel-arm resonator included in the ladder acoustic wave filter is defined as a parallel-arm circuit, all of the at least one series-arm resonator is defined as a series-arm circuit, and all of the at least one longitudinally coupled resonator included in the longitudinally coupled acoustic wave filter is defined as a longitudinally coupled circuit;
areas in the first region and the second region where the acoustic wave resonator included in the series-arm circuit or the longitudinally coupled circuit is provided are defined as a third area and a fourth area; and
the fourth area is greater than the third area.

16. The acoustic wave device according to claim 15, wherein the piezoelectric substrate of the first filter includes silicon.

17. The acoustic wave device according to claim 15, wherein the acoustic wave resonator included in the second filter includes an interdigital transducer electrode.

18. The acoustic wave device according to claim 15, wherein
the acoustic wave device is a multiplexer including the first filter and the second filter connected to a common terminal;
the first filter defines and functions as a transmission filter that transmits a signal through the common terminal; and
the second filter defines and functions as a reception filter that receives a signal received at the common terminal.

19. The acoustic wave device according to claim 15, wherein the electrically conductive layer includes a metal material.

20. The acoustic wave device according to claim 19, wherein the electrically conductive layer is at a ground potential.

21. The acoustic wave device according to claim 15, wherein the second filter includes a cover layer between the piezoelectric substrate of the second filter and the mount board, and the piezoelectric substrate and the cover layer define a hollow space; and the acoustic wave resonator included in the second filter is on the piezoelectric substrate of the second filter in the hollow space.

22. An acoustic wave device, comprising:

a mount board;

a first filter on the mount board and having a first pass band;

a second filter on the mount board adjacent to the first filter in a first direction, and having a second pass band lower than the first pass band;

a resin layer disposed on the mount board to seal the first filter and the second filter; and an electrically conductive layer covering the resin layer; wherein each of the first filter and the second filter includes:
   a piezoelectric substrate; and
   an acoustic wave resonator on the piezoelectric substrate;

the first filter is in contact with the electrically conductive layer;

the second filter is not in contact with the electrically conductive layer;

the second filter is a ladder acoustic wave filter including at least one parallel-arm resonator and at least one series-arm resonator, or a longitudinally coupled acoustic wave filter including at least one longitudinally coupled resonator;

a thermal resistance value of the piezoelectric substrate in the second filter in the first direction is greater than a thermal resistance value of the piezoelectric substrate in the first filter in the first direction;

the second filter has characteristics to lower the second pass band in response to a temperature rise of the piezoelectric substrate of the second filter;

with respect to a virtual line perpendicular or substantially perpendicular to the first direction and passing through a center of the piezoelectric substrate of the second filter, a region of the piezoelectric substrate closer to the first filter is defined as a first region, and a region of the piezoelectric substrate opposite to the region closer to the first filter is defined as a second region;

all of the at least one parallel-arm resonator included in the ladder acoustic wave filter is defined as a parallel-arm circuit, all of the at least one series-arm resonator is defined as a series-arm circuit, and all of the at least one longitudinally coupled resonator included in the longitudinally coupled acoustic wave filter is defined as a longitudinally coupled circuit;

areas in the first region and the second region where the acoustic wave resonator included in the series-arm circuit or the longitudinally coupled circuit is provided are defined as a third area and a fourth area; and the third area is greater than the fourth area.

23. The acoustic wave device according to claim 22, wherein the piezoelectric substrate of the first filter includes silicon.

24. The acoustic wave device according to claim 22, wherein the acoustic wave resonator included in the second filter includes an interdigital transducer electrode.

25. The acoustic wave device according to claim 22, wherein
the acoustic wave device is a multiplexer including the first filter and the second filter connected to a common terminal;
the first filter defines and functions as a transmission filter to transmit a signal through the common terminal; and
the second filter defines and functions as a reception filter to receive a signal received at the common terminal.

26. The acoustic wave device according to claim 22, wherein the electrically conductive layer includes a metal material.

27. The acoustic wave device according to claim 26, wherein the electrically conductive layer is at a ground potential.

28. The acoustic wave device according to claim 22, wherein
the second filter includes a cover layer between the piezoelectric substrate of the second filter and the mount board, and the piezoelectric substrate and the cover layer define a hollow space; and
the acoustic wave resonator included in the second filter is on the piezoelectric substrate of the second filter in the hollow space.

* * * * *